(12) United States Patent
Chung

(10) Patent No.: US 11,378,446 B2
(45) Date of Patent: Jul. 5, 2022

(54) METHOD FOR DETECTING INTENSITY AS FUNCTION OF ENERGY OF LIGHT AND DEVICES FOR PERFORMING SAME

(71) Applicant: KONKUK UNIVERSITY INDUSTRIAL COOPERATION CORP, Seoul (KR)

(72) Inventor: Hyun Jong Chung, Hwaseong-Si (KR)

(73) Assignee: KONKUK UNIVERSITY INDUSTRIAL COOPERATION CORP, Seoul (KR)

( * ) Notice: Subject to any disclaimer, the term of this patent is extended or adjusted under 35 U.S.C. 154(b) by 325 days.

(21) Appl. No.: 16/755,830

(22) PCT Filed: Oct. 12, 2018

(86) PCT No.: PCT/KR2018/012040
§ 371 (c)(1),
(2) Date: Apr. 13, 2020

(87) PCT Pub. No.: WO2019/074324
PCT Pub. Date: Apr. 18, 2019

(65) Prior Publication Data
US 2020/0333181 A1     Oct. 22, 2020

(30) Foreign Application Priority Data

Oct. 13, 2017  (KR) .................. 10-2017-0133496

(51) Int. Cl.
*G01J 1/16* (2006.01)
*G01D 1/10* (2006.01)
(Continued)

(52) U.S. Cl.
CPC .............. *G01J 1/1626* (2013.01); *G01D 1/10* (2013.01); *G06F 17/14* (2013.01); *H01L 31/08* (2013.01)

(58) Field of Classification Search
CPC .... G01J 1/1626; G01J 3/42; G01J 3/36; G01J 1/42; G01J 1/16; G01D 1/10; G01D 1/04;
(Continued)

(56) References Cited

U.S. PATENT DOCUMENTS

2016/0379814 A1    12/2016  Yamada et al.
2017/0110564 A1*   4/2017   Kim ................... H01L 29/66037
2018/0351024 A1*   12/2018  Ma .......................... G01J 1/0488

FOREIGN PATENT DOCUMENTS

JP      2012-210321 A    11/2012
JP      2013-152118 A     8/2013
(Continued)

OTHER PUBLICATIONS

International Search Report (ISR) and Written Opinion of the International Searching Authority (Form PCT/ISA/237) dated Feb. 18, 2019, issued in counterpart International Application No. PCT/KR2018/012040, with English Translation of ISR (total 10 pages).

*Primary Examiner* — Thanh Luu
*Assistant Examiner* — Monica T Taba
(74) *Attorney, Agent, or Firm* — WHDA, LLP

(57) ABSTRACT

A barristor-based photodetector is disclosed. The photodetector according to an embodiment comprises: a substrate; a gate electrode which is laminated on the substrate; a first electrode and a second electrode which are laminated on the substrate and spaced apart from the gate electrode; a graphene layer which is formed between the substrate and the second electrode and extends toward the first electrode; and a gate insulating layer which is formed between the gate electrode and the graphene layer.

28 Claims, 14 Drawing Sheets

(51) Int. Cl.
*G06F 17/14* (2006.01)
*H01L 31/08* (2006.01)

(58) Field of Classification Search
CPC ....... G06F 17/14; H01L 31/08; H01L 31/028; H01L 31/113
See application file for complete search history.

(56) References Cited

FOREIGN PATENT DOCUMENTS

| KR | 10-2012-0092431 A | 8/2012 |
|----|-------------------|--------|
| KR | 10-2014-0022607 A | 2/2014 |
| KR | 10-2014-0134131 A | 11/2014 |
| KR | 10-2015-0120911 A | 10/2015 |
| KR | 10-2016-0017491 A | 2/2016 |
| KR | 10-2016-0124983 A | 10/2016 |
| KR | 10-2017-0058176 A | 5/2017 |
| WO | 2015/136695 A1 | 4/2017 |

* cited by examiner 711-1 through 711-n 711-1 through 711-n

METHOD FOR DETECTING INTENSITY AS FUNCTION OF ENERGY OF LIGHT AND DEVICES FOR PERFORMING SAME

TECHNICAL FIELD

The following example embodiments relate to a method of extracting a light intensity based on energy of light and apparatuses for performing the method.

BACKGROUND ART

A photodetector based on an existing semiconductor determines minimum energy of absorbed light based on a size of a band gap of a semiconductor. Here, the photodetector detects (or absorbs) light corresponding to minimum energy of the semiconductor or light greater than the light.

In a photodetector using a Schottky diode, minimum energy of absorbed light is determined based on a height. Here, energy of light absorbed by the photodetector is determined by a specific semiconductor or a specific combination of semiconductor metals, and it is impossible to change the energy after fabrication.

DISCLOSURE OF INVENTION

Technical Subject

Example embodiments may provide technology of adjusting a wavelength band of minimum energy of absorbed light by changing gate voltage for a gate electrode, to specify and vary a wavelength band of energy of the absorbed light and detect and measure energy of light, and an intensity based on the energy of the light.

Also, example embodiments may provide technology of adjusting a wavelength band of minimum energy of absorbed light to be further widened, using a two-dimensional (2D) semiconductor having a characteristic in which an energy band gap varies depending on a thickness, and of more widely varying a wavelength band of energy of the absorbed light.

Also, example embodiments may provide technology of amplifying an electric signal based on light absorbed by a photoconductor by applying high voltage between a first electrode and a second electrode and using a first substrate that includes an n− type doped region, an n+ type doped region and an intrinsic region.

Also, example embodiments may provide technology of extracting an intensity value based on energy of light projected to a barristor device included in a photodetector by measuring and transforming a spectral response of the barristor device and photocurrent of the light projected to the barristor device.

Also, example embodiments may provide technology of utilizing a photodetector for detecting and measuring energy of light and an intensity based on the energy of the light in a sensor that measures various wavelength bands.

Technical Solution

According to an aspect, there is provided a method of extracting a light intensity based on energy of light, the method including measuring a spectral response of a barristor device included in a photodetector, and photocurrent of light projected to the barristor device, and extracting an intensity value based on energy of the light by performing a Fourier transform on the spectral response and the photocurrent.

The measuring may include measuring the spectral response, and measuring at least one of the photocurrent and a differential value of the photocurrent, based on gate voltage of the photodetector.

The measuring of at least one of the photocurrent and the differential value of the photocurrent may include measuring the differential value of the photocurrent through a lock-in amplification scheme.

The measuring of the spectral response may include determining the spectral response using the following equation:

$$\text{Spectral Response} = T(\Phi_B(V_G) - E) \qquad \text{[Equation]}$$

Here, Spectral Response denotes the spectral response, $V_G$ denotes gate voltage of the barristor device, $\Phi_B$ denotes a Schottky barrier height of the barristor device, T denotes a function value of a Schottky barrier of the barristor device, and E denotes energy of light projected to the barristor device.

The measuring of at least one of the photocurrent and the differential value of the photocurrent may further include determining the photocurrent using the following equation:

$$I_{ph}(V_G) = \int \psi(E) T(\Phi_B(V_G) - E) dE \qquad \text{[Equation]}$$

Here, $I_{ph}$ denotes the photocurrent, $I_{ph}(V_G)$ denotes photocurrent based on the gate voltage of the barristor device, and $\psi(E)$ denotes an intensity value based on the energy of the light projected to the barristor device.

The measuring of at least one of the photocurrent and the differential value of the photocurrent may further include determining the differential value of the photocurrent using the following equation:

$$\frac{\partial I_{ph}}{\partial V_G} = \int \psi(E) \frac{\partial T(\Phi_B(V_G) - E)}{\partial V_G} dE \qquad \text{[Equation]}$$

Here, $$\frac{\partial I_{ph}}{\partial V_G}$$

denotes the differential value of the photocurrent.

The extracting may include performing a Fourier transform on the spectral response, performing a Fourier transform on at least one of the photocurrent and the differential value of the photocurrent, performing a deconvolution based on a Fourier transform result for the spectral response and at least one of a Fourier transform result for the photocurrent and a Fourier transform result for the differential value of the photocurrent, and extracting the intensity value based on the energy of the light by performing an inverse Fourier transform on a result of the deconvolution.

A Fourier transform value for the spectral response may be determined using the to following equation:

$$F\{T(\Phi_B(V_G) - E)\} \qquad \text{[Equation]}$$

Here, F{ } denotes a Fourier transform function.

A Fourier transform value for the photocurrent may be determined using the is following equation:

$$F\{I_{ph}(V_G)\} = F\{\psi(E)\} F\{T(\Phi_B(V_G) - E)\} \qquad \text{[Equation]}$$

A Fourier transform value for the differential value of the photocurrent may be determined using the following equation:

$$F\left\{\frac{\partial I_{ph}}{\partial V_G}\right\} = F\{\psi(E)\}F\left\{\frac{\partial T(\Phi_B(V_G)-E)}{\partial V_G}\right\}$$ [Equation]

A deconvolution result for the photocurrent may be determined using the following equation:

$$F\{\psi(E)\}=F\{T(\Phi_B(V_G)-E)\}/F\{I_{ph}\}$$ [Equation]

A deconvolution result for the differential value of the photocurrent may be determined using the following equation:

$$F\{\psi(E)\} = F\left\{\frac{\partial T(\Phi_B(V_G)-E)}{\partial V_G}\right\} \bigg/ F\left\{\frac{\partial I_{ph}}{\partial V_G}\right\}$$ [Equation]

An intensity value based on energy of light through the photocurrent may be determined using the following equation:

$$\psi(E) = F^{-1}\left\{\frac{F\{T(\Phi_B(V_G)-E)\}}{F\{I_{ph}\}}\right\}$$ [Equation]

An intensity value based on energy of light through the differential value of the photocurrent may be determined using the following equation:

$$\psi(E) = F^{-1}\left\{\frac{F\left\{\frac{\partial T(\Phi_B(VG)-E)}{\partial V_G}\right\}}{F\left\{\frac{\partial I_{ph}}{\partial V_G}\right\}}\right\}$$ [Equation]

According to another aspect, there is provided an apparatus for extracting a light intensity based on energy of light, the apparatus including a transceiver configured to communicate with a photodetector, and a controller configured to measure a spectral response of a barristor device included in the photodetector, and photocurrent of light projected to the barristor device, and configured to extract an intensity value based on energy of the light by performing a Fourier transform on the spectral response and the photocurrent.

The controller may include a measurer configured to measure the spectral to response and to measure at least one of the photocurrent and a differential value of the photocurrent based on gate voltage of the photodetector.

The measurer may be configured to measure the differential value of the photocurrent through a lock-in amplification scheme.

The measurer may be configured to determine the spectral response using the following equation:

Spectral Response=$T(\Phi_B(V_G)-E)$ [Equation]

Here, Spectral Response denotes the spectral response, $V_G$ denotes gate voltage of the barristor device, $\Phi_B$ denotes a Schottky barrier height of the barrister device. T denotes a function value of a Schottky barrier of the barristor device, and E denotes energy of light projected to the barristor device.

The measurer may be configured to determine the photocurrent using the following equation:

$$I_{ph}(V_G)=\int \psi(E)T(\Phi_B(V_G)-E)dE$$ [Equation]

Here, $I_{ph}$ denotes the photocurrent, $I_{ph}(V_G)$ denotes photocurrent based on the gate voltage of the barristor device, and $\psi(E)$ denotes an intensity value based on the energy of the light projected to the barristor device.

The measurer may be configured to determine the differential value of the photocurrent using the following equation:

$$\frac{\partial I_{ph}}{\partial V_G} = \int \psi(E)\frac{\partial T(\Phi_B(V_G)-E)}{\partial V_G}dE$$ [Equation]

Here, $$\frac{\partial I_{ph}}{\partial V_G}$$

denotes the differential value of the photocurrent.

The controller may include an extractor configured to perform a Fourier transform on the spectral response, to perform a Fourier transform on at least one of the photocurrent and the differential value of the photocurrent, to perform a deconvolution based on a Fourier transform result for the spectral response and at least one of a Fourier transform result for the photocurrent and a Fourier transform result for the differential value of the photocurrent, and to extract the intensity value based on the energy of the light by performing an inverse Fourier transform on a result of the deconvolution.

A Fourier transform value for the spectral response may be determined using the following equation:

$$F\{T(\Phi_B(V_G)-E)\}$$ [Equation]

Here, F{ } denotes a Fourier transform function.

A Fourier transform value for the photocurrent may be determined using the following equation:

$$F\{I_{ph}(V_G)\}=F\{\psi(E)\}F\{T(\psi_B(V_G)-E)\}$$ [Equation]

A Fourier transform value for the differential value of the photocurrent may be determined using the following equation:

$$F\left\{\frac{\partial I_{ph}}{\partial V_G}\right\} = F\{\psi(E)\}F\left\{\frac{\partial T(\Phi_B(V_G)-E)}{\partial V_G}\right\}$$ [Equation]

A deconvolution result for the photocurrent may be determined using the following equation:

$$F\{\psi(E)\}=F\{T(\Phi_B(V_G)-E)\}/F\{I_{ph}\}$$ [Equation]

A deconvolution result for the differential value of the photocurrent may be determined using the following equation:

$$F\{\psi(E)\} = F\left\{\frac{\partial T(\Phi_B(V_G)-E)}{\partial V_G}\right\} \bigg/ F\left\{\frac{\partial I_{ph}}{\partial V_G}\right\}$$ [Equation]

An intensity value based on energy of light through the photocurrent may be determined using the following equation:

$$\psi(E) = F^{-1}\left\{\frac{F\{T(\Phi_B(V_G)-E)\}}{F\{I_{ph}\}}\right\}$$ [Equation]

An intensity value based on energy of light through the differential value of the photocurrent may be determined using, the following, equation:

$$\psi(E) = F^{-1}\left\{\frac{F\left\{\frac{\partial T(\Phi_B(V_G)-E)}{\partial V_G}\right\}}{F\left\{\frac{\partial I_{ph}}{\partial V_G}\right\}}\right\}$$ [Equation]

BEST MODE FOR CARRYING OUT THE INVENTION

Figure 1:
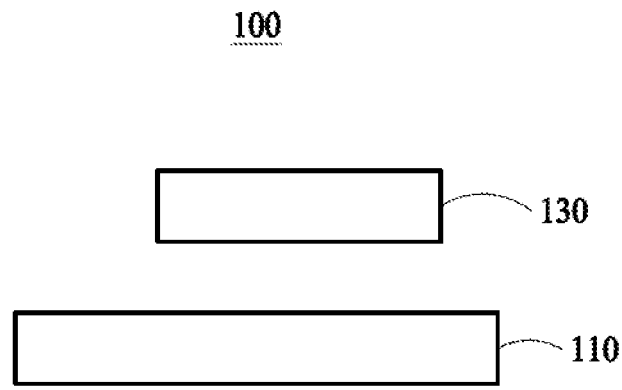
FIG. 1 schematically illustrates a structure of a barristor device to describe a concept of a photodetector according to an example embodiment.

Specific structural or functional descriptions of example embodiments according to the concept of the present invention are merely intended for the purpose of describing example embodiments and the example embodiments may be implemented in various forms and should not be construed as being limited to those described in the present disclosure.

Various modifications av be made to the example embodiments, some of which will be illustrated in detail in the drawings and detailed description. However, it should be understood that these example embodiments are not construed as limited to the illustrated forms and include all changes, equivalents or alternatives within the idea and the technical scope of the present invention.

Although terms of "first" or "second" are used to explain various components, the components are not limited to the terms. These terms are used only to distinguish one component from another component. For example, a "first" component lay be referred to as a "second" component, or similarly, the "second" component may be referred to as the "first" component within the scope of the right according to the concept of the present invention.

It should be noted that if it is described in the specification that one component is "connected," or "coupled" to another component, a third component may be "connected," and "coupled" between the first and second components, although the first component may be directly connected, coupled or joined to the second component. In addition, it should be noted that if it is described in the specification that one component is "directly connected" or "directly coupled" to another component, a third component may not be present therebetween. Likewise, expressions, for example, "between" and "immediately between" and "adjacent to" and "immediately adjacent to" may also be construed as described in the foregoing.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "may include" and/or "comprising," when used in this specification, specify the presence a stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings. The scope of the right, however, should not be construed as limited to the example embodiments set forth herein. Regarding the reference numerals assigned to the elements in the drawings, it should be noted that the same elements will be designated by the same reference numerals.

FIG. 1 schematically illustrates a structure of a barristor device to describe a concept of a photodetector according to an example embodiment.

Referring to FIG. 1, a barristor device 100 includes a substrate 110 and a graphene layer 130.

The barristor device 100 may further include a plurality of electrodes, for example, a gate electrode (not shown), a source electrode (not shown) and a drain electrode (not shown). The plurality of electrodes may be laminated above or below the substrate 100 and/or the graphene layer 130 such that voltage may be applied.

The substrate 110 may be implemented as a semiconductor substrate or a nonconductor substrate. When the substrate 110 is implemented as a semiconductor substrate, the semiconductor substrate may be doped with either i-type impurities or p-type impurities. For example, the semiconductor substrate may be formed of silicon, germanium silicon-germanium, a Group III-V semi-conductor, a Group II-VI semiconductor, a semiconducting CNT, a two-dimensional (2D) semiconductor (for example, $MoS_2$, and $WS_2$) including transition metal dichalcogenides (TMDs), IZO, GIZO, and the like.

The graphene layer 130 may be formed by transferring graphene manufactured by chemical vapor deposition (CVD) and patterning the transferred graphene. For to example, the graphene layer 130 may be implemented by a single layer through four layers of graphene. The graphene layer 130 may be a path through which carriers are moved.

The graphene layer 130 may be directly grown and formed on the substrate 110.

The graphene layer 130, for example, a work function of graphene, may vary depending on gate voltage applied to a gate electrode due to inherent properties of graphene. Also, an energy band of the substrate 110 may be affected by the gate voltage.

A height (or a size) of an energy barrier (or a junction) between the graphene layer 130 and the substrate 110 may be determined based on a difference between the work function of the graphene based on the gate voltage and an energy band (or a conduction band or a valence band) of the substrate 110.

In other words, the barristor device 100 may control the height of the energy barrier between the graphene layer 130 and the substrate 110 based on the gate voltage. Accordingly, a photodetector based on the barristor device 100 may absorb energy of various lights by controlling the height of the energy barrier between the graphene layer 130 and the substrate 110 based on the gate voltage. Also, in a state in which energy of light is fixed, it is impossible for the photodetector to absorb light when the height of the energy barrier is greater than the energy of the light, however, the photodetector may absorb light when the height of the energy barrier is less than or equal to the energy of the light.

Controlling of the energy barrier of the barristor device 100 will be described based on energy band diagrams of the barristor device 100 with reference to FIGS. 2A through 3B.

Figure 2A:
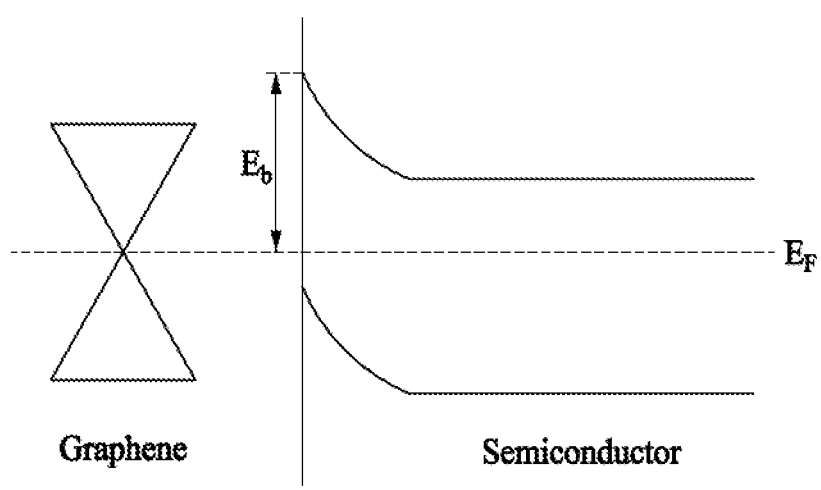
FIGS. 2A and 2B illustrate an example of an energy band diagram of the barristor device of FIG. 1.
Figure 2B:
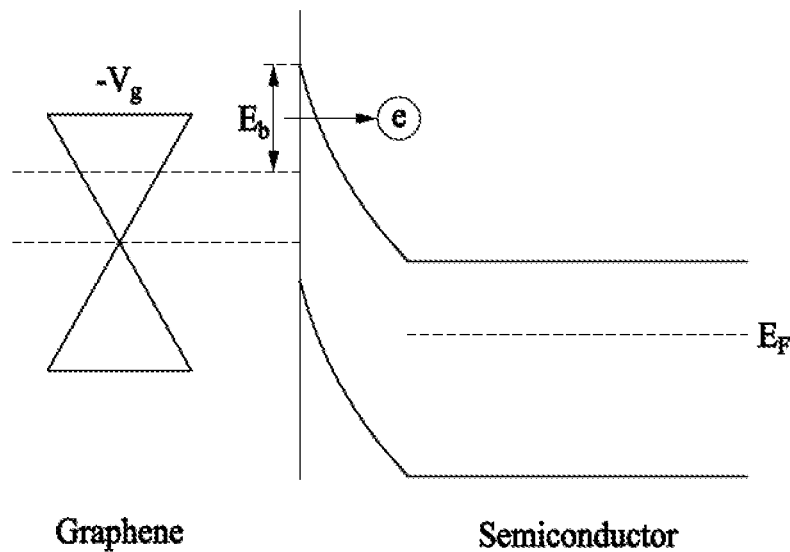

FIGS. 2A and 2B illustrate an example of an energy band diagram of the barristor device of FIG. 1.

FIGS. 2A and 2B illustrate energy band diagrams of the barristor device IGO when the substrate 110 is a substrate of a semiconductor doped with n– type impurities, or a semiconductor in which an energy difference between a Dirac point of the graphene and a conduction band is less than an energy difference between the Dirac point and a valence band.

Referring to FIG. 2A, in a state in which voltage is not applied to the plurality of electrodes, an energy band structure of the barristor device 100 may be formed corresponding to the energy band of the substrate 110 and the work function of the graphene. Here, a carrier of the barristor device 100 may become an electron and a movement of the carrier may be limited by an energy barrier $E_b$ between the graphene layer 130 and the substrate 110. $E_F$ refers to a Fermi energy level of the graphene layer 130.

Referring to FIG. 2B, in a state in which positive voltage is applied to the drain electrode, reverse bias voltage is applied between a source (or the source electrode) and a drain (or the drain electrode) and the energy barrier a is still large.

Here, when arbitrary plus voltage is applied to the gate electrode, the energy barrier $E_b$ of the substrate 110 &creases as the Fermi energy level $E_F$ of the graphene layer 130 moves upward as indicated by an arrow. Accordingly, the carrier may be easily transferred from the graphene layer 130 to the substrate 110.

Figure 3A:
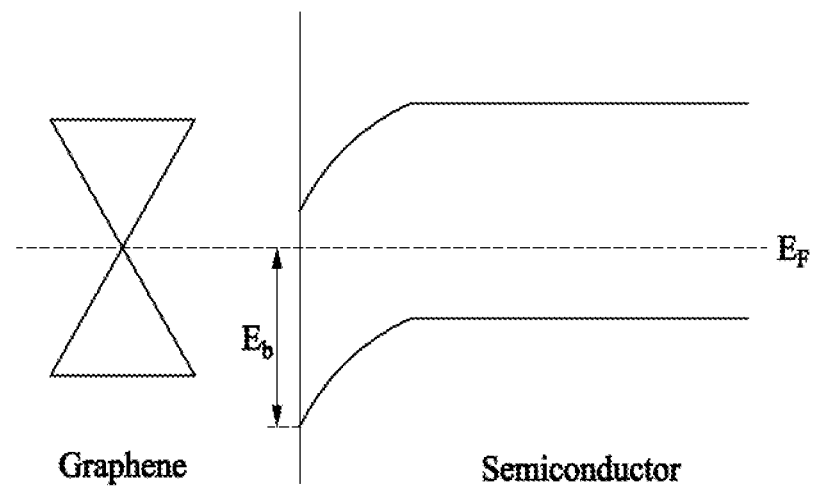
FIGS. 3A and 3B illus ate another example of the energy band diagram of the barristor device of FIG. 1.
Figure 3B:
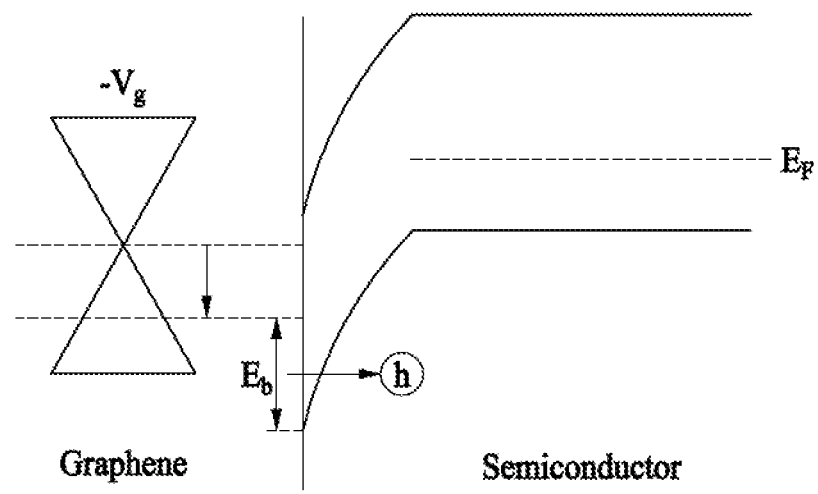

FIGS. 3A and 3B illustrate another example of the energy band diagram of the barristor device of FIG. 1.

FIGS. 3A and 3B illustrate energy band diagrams of the barristor device 100 when the substrate 110 is a substrate of a. semiconductor doped with p-type impurities, or a semiconductor in which an energy difference between a Dirac point of the graphene and a valence band is less than an energy difference between the Dirac point and a conduction band.

Referring to FIG. 3A, in a state in which voltage is not applied to the plurality of electrodes, an energy band structure of the barristor device 100 may be formed corresponding to the energy band of the substrate 110 and the work function of the graphene. Here, a carrier of the barristor device 100 may become a hole and a movement of the carrier may be limited by an energy barrier $E_b$ between the graphene layer 130 and the substrate 110. $E_F$ refers to a Fermi energy level of the graphene layer 130.

Referring to FIG. 3B, in a state in which negative voltage is applied to the drain electrode, reverse bias voltage is applied between a source (or the source electrode) and a drain (or the drain electrode) and the energy barrier a is still large.

Here, when arbitrary minus voltage is applied to the gate electrode, the energy barrier $E_b$ of the substrate 110 may decrease as the Fermi energy level $E_F$ of the graphene layer 130 moves downward as indicated by an arrow. Accordingly, the carrier may be easily transferred from the graphene layer 130 to the substrate 110.

Since the energy barrier a of the substrate 110 is adjusted based on a magnitude of the gate voltage as described above with reference to FIGS. 2A through 3B, an energy barrier $E_b$ of the barristor device 100 may also be adjusted. For example, the energy barrier $E_b$ of the barrister device 100 may adjust a barrier height of about 0.6 eV. The energy barrier $E_b$ of the barrister device 100 may a height of a Schottky barrier based on the magnitude of the gate voltage. The height of the Schottky barrier may occur between the substrate 110 and the graphene layer 130.

Hereinafter, a barristor device-based photodetector 10 shown in FIGS. 4 through 8 will be described.

Figure 4:
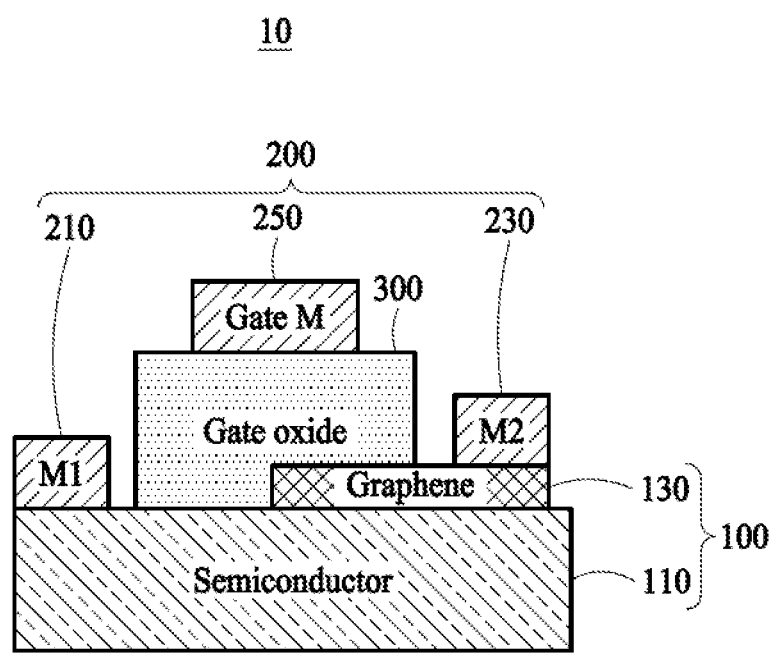
FIG. 4 illustrates an example of a barristor device-based photodetector.

FIG. 4 illustrates an example of a barristor device-based photodetector.

Referring to FIG. 4, a photodetector 10 includes a substrate 110, a graphene layer 130, a plural electrodes 200, and a gate insulating, layer 300. The electrodes 200 may include a first electrode 210, a second electrode 230, and a gate electrode 250.

The substrate 110 may be implemented as a semiconductor substrate. For example, the semiconductor substrate may include one of silicon, germanium, silicon-germanium, a Group III-V semiconductor, a Group II-VI semiconductor, a semiconducting CNT, $MoS_2$, IZO, and GIZO.

On the substrate 110, the graphene layer 130, the electrodes 200, and the gate insulating layer 300 may be laminated. For example, the graphene layer 130, the first electrode 210, and the gate insulating layer 300 may be laminated on the substrate 110 to be in direct contact with the substrate 110. The second electrode 230 and the gate electrode 250 may be laminated without contacting the substrate 110.

The graphene layer 130 may be formed between the substrate 110 and the second electrode 230 and may extend toward the first electrode 210. For example, the graphene layer 130 may directly contact the substrate 110, the second electrode 230 and the gate insulating layer 300, and may extend from the second electrode 230 toward the first electrode 210. The graphene layer 130 may be spaced apart from the first electrode 210 and the gate electrode 250 and disposed not to contact the first electrode 210 and the gate electrode 250.

The first electrode 210 and the second electrode 230 may be laminated on and above the substrate 110 and spaced apart from the gate electrode 250.

For example, the first electrode 210 may be laminated on the substrate 110 to be in direct contact with the substrate 110. The first electrode 210 may be spaced apart from the graphene layer 130, the second electrode 230, the gate electrode 250 and the gate insulating layer 300, and disposed not to contact the graphene layer 130, the second to electrode 230, the gate electrode 250 and the gate insulating layer 300.

The second electrode 230 may be laminated on the graphene layer 130 to be in direct contact with the graphene layer 130. Here, the graphene layer 130 may be laminated on the substrate 110 to be in direct contact with the substrate 110. The second electrode 230 may be spaced apart from the substrate 110, the first electrode 210, the gate electrode 250 and the gate insulating layer 300 and disposed not to contact the substrate 110, the first electrode 210, the gate electrode 250 and the gate insulating layer 300.

The gate electrode 250 may be laminated above the substrate 110 and disposed not to contact the substrate 110. For example, the gate electrode 250 may be laminated on the gate insulating layer 300 to be in direct contact with the gate insulating layer 300. Here, the gate insulating layer 300 may be laminated on the substrate 110 to be in direct contact with the substrate 110. The gate electrode 250 may be spaced apart from the substrate 110, the graphene layer 130, the first electrode 210 and the second electrode 230, and disposed not to contact the substrate 110, the graphene layer 130, the first electrode 210 and the second electrode 230.

The gate insulating layer 300 may be formed between the gate electrode 250 and the graphene layer 130. For example, the gate insulating layer 300 may directly contact the substrate 110, the graphene layer 130 mid the gate electrode 230, and may be formed between the gate electrode 250 and the graphene layer 130. The gate insulating layer 300 may be spaced apart from the first electrode 210 and the second electrode 230 and disposed not to contact the first electrode 210 and the second electrode 230.

Figure 5:
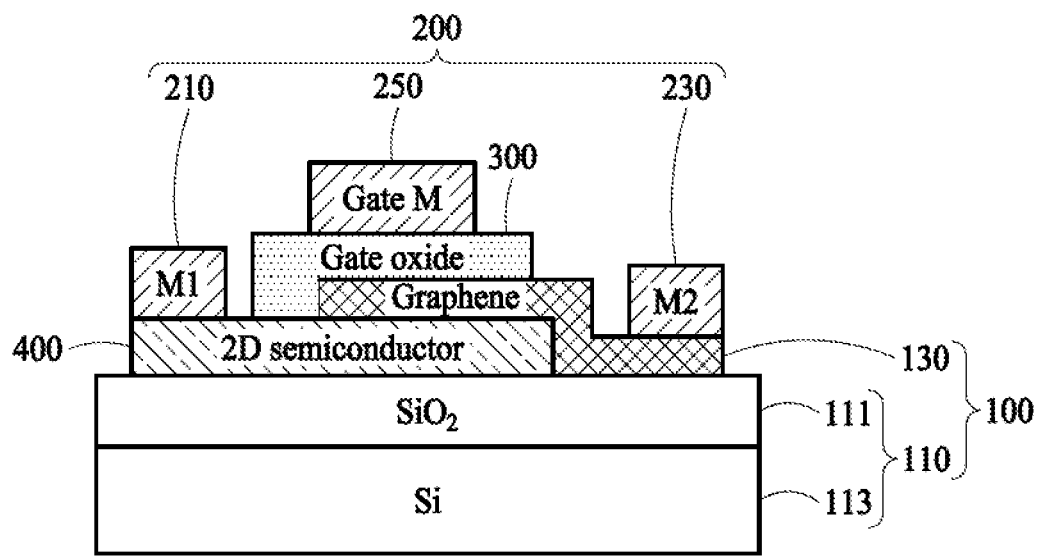
FIG. 5 illustrates another example of a barristor device-based photodetector.
Figure 6:
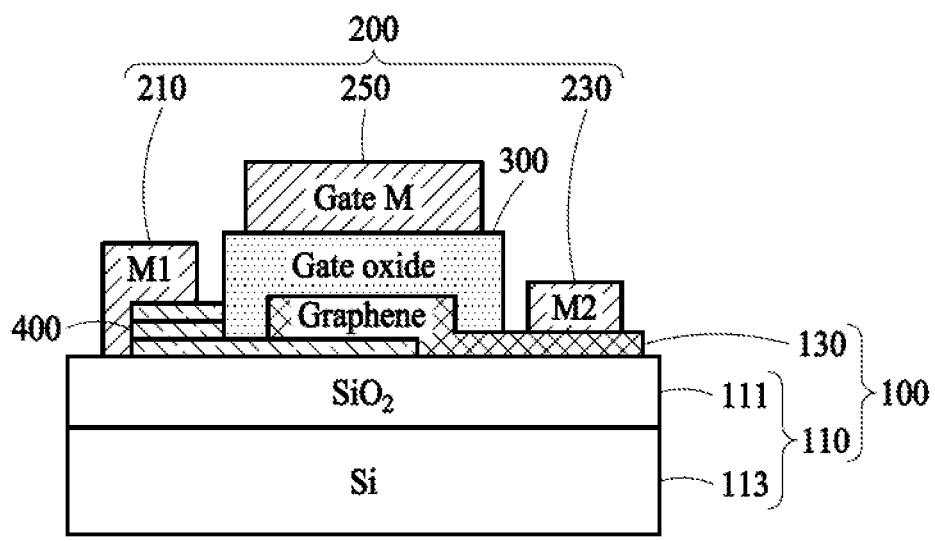
FIG. 6 illustrates still another example of a. barristor device-based photodetector.
Figure 7:
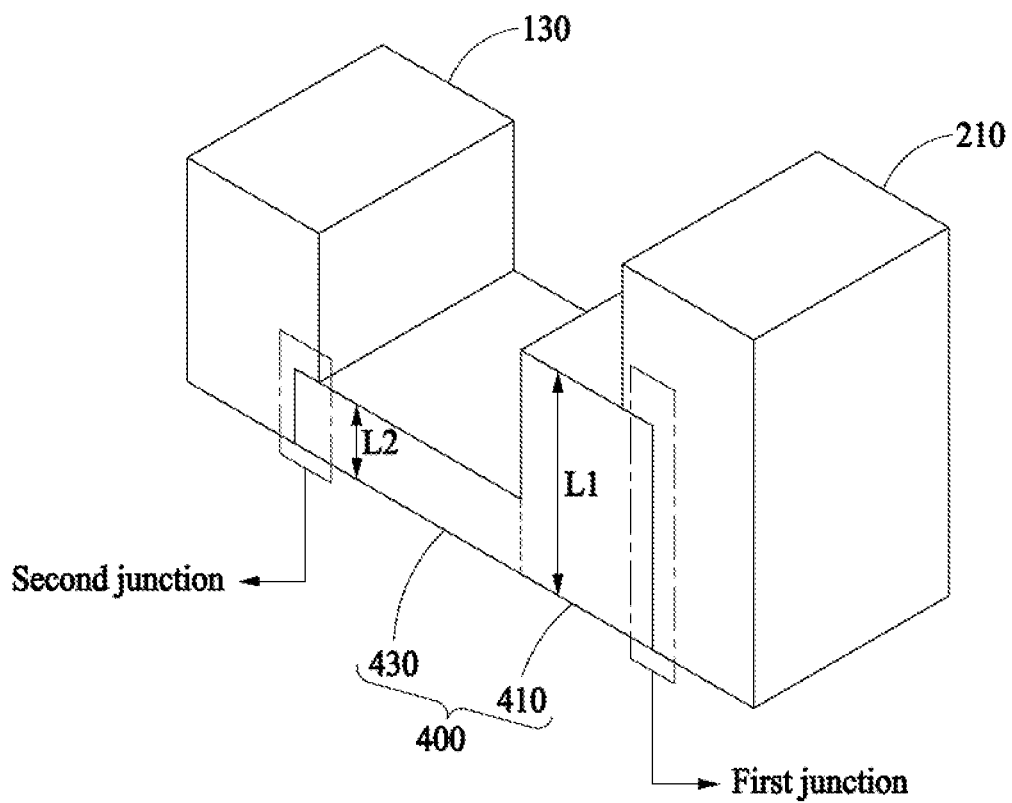
FIG. 7 illustrates an example of a two-dimensional (2D) semiconductor of a photodetector shown in FIG. 6.

FIG. 5 illustrates another example of a barristor device-based photodetector, FIG. 6 illustrates still another example of a barrister device-based photodetector, and FIG. 7 illustrates an example of a 2D semiconductor of a photodetector shown in FIG. 6.

Referring to FIGS. 5 and 6, photodetectors 10 of FIGS. 5 and 6 have similar to shapes to that of the photodetector 10 of FIG. 4. However, each of the photodetectors 10 of FIGS. 5 and 6 further includes a 2D semiconductor 400.

The substrate 110 may be implemented as a nonconductor substrate. For example, the nonconductor substrate may include at least one. $SiO_2$ 111 may be disposed in an upper portion of the substrate 110, and Si 113 may be disposed in a lower portion of the substrate 110.

On the substrate 110, a graphene layer 130, a plurality of electrodes 200, a gate insulating layer 300, and the 2D semiconductor 400 may be laminated. For example, the graphene layer 130 and the 2D semiconductor 400 may be laminated on the substrate 110 to be in direct contact with the substrate 110. The first electrode 210, the second electrode 230, the gate electrode 250 and the gate insulating layer300 may be laminated without contacting the substrate 110.

The graphene layer 130 may be formed between the substrate 110 and the second electrode 230 and may extend toward the first electrode 210. For example, the graphene layer 130 may directly contact the substrate 110, the second electrode 230, the gate electrode 230 toward the first electrode 210. The graphene layer 130 may be spaced apart from the first electrode 210 and the gate electrode 250 and disposed not to contact the first electrode 210 and the gate electrode 250.

The first electrode 210 and the second electrode 230 may be laminated above the substrate 110 and spaced apart from the gate electrode 250.

For example, the first electrode 210 may be laminated on the 2D semiconductor 400 to be in direct contact with the 2D semiconductor 400. Here, the 2D semiconductor 400 may be laminated on the substrate 110 to be in direct contact with the substrate 110. The first electrode 210 may be spaced apart from the substrate 110, the graphene layer 130, the second electrode 230, the gate electrode 250 and the gate insulating layer 300, and disposed not to contact the substrate 110, the graphene layer 130, the second electrode 230, the gate electrode 250 and the gate insulating, layer 300.

The second electrode 230 may be laminated on the graphene layer 130 to be in direct contact with the graphene layer 130. Here, the graphene layer 130 may be laminated on the substrate 110 to be in direct contact with the substrate 110. The second electrode 230 may be spaced apart from the substrate 110, the first electrode 210, the gate electrode 250 and the gate insulating layer 300, and disposed not to contact the substrate 110, the first electrode 210, the gate electrode 250 and the gate insulating layer 300.

The gate electrode 250 is similar to that of FIG. 4, and accordingly further description thereof is omitted.

The gate insulating Ever 300 may be formed between the gate electrode 250 and the graphene layer 130. For example, the gate insulating layer 300 may directly contact the graphene layer 130, the gate electrode 230 and the 2D semiconductor 400, and may be formed between the gate electrode 250 and the graphene layer 130. The gate insulating layer 300 may be spaced apart from the substrate 110, the first electrode 210 and the second electrode 230 and disposed not to contact the substrate 110, the first electrode 210 and the second electrode 230.

The 2D semiconductor 400 my include at least one of tungsten disulfide, transition metal dichalcogenides (TMDs), and black phosphor For example, TMDs may include at least one of $WSe_2$, $MoS_2$, $MoSe_2$, and $MoTe_2$.

The 2D semiconductor 400 may be formed to contact the first electrode 210 and the graphene layer 130. For example, the 2D semiconductor 400 may be formed to directly contact the substrate 110, the graphene layer 130, the first electrode 210, and the gate insulating layer 300. The 2D semiconductor 400 may be spaced apart from the second electrode 230 and the gate electrode 250 and disposed not to contact the second electrode 230 and the gate electrode 250.

The 2D semiconductor 400 includes a first layer formed with a first thickness, and a second layer formed with a second thickness. For example, the first thickness may be one of the same thickness as the second thickness and a thickness different from the second thickness. A 2D semiconductor 400 of FIG. 7 may include a first layer 410 formed with a first thickness L1, and a second layer 430 formed with a second thickness L2. Here, the second thickness L2 may be greater than the first thickness L1. For example, the first layer 410 and the second layer 430 may be formed with different thicknesses through at least one of a semiconductor growth, a thermal etching scheme, a chemical etching scheme, and a laser etching scheme.

The first layer may form a first junction with the first electrode 210, and the second layer may form a second junction with the graphene layer 130. For example, the first junction may be one of a Schottky junction and an ohmic junction, and the second junction may be one of the Schottky junction and the ohmic junction. In FIG. 7, a first junction formed between the first layer 410 and the first electrode 210, that is, a drain electrode may be an ohmic junction. A second junction between the second layer 430 and the graphene layer 130 may be a Schottky junction.

The 2D semiconductor 400 may have a characteristic (or properties) in which an energy band gap of the 2D semiconductor 400 varies depending on a thickness of a layer. For example, the 2D semiconductor 100 may form a Schottky junction having various barrier sizes from an ohmic junction by a junction of metal. Here, a size of a Schottky barrier may be controlled based on a thickness of the 2D semiconductor 400.

Current may or may not flow in the 2D semiconductor 400 by voltage of the first electrode 210, When a forward bias (for example, $V_D$>0) is input, the 2D semiconductor 400 may not have a. barrier that hinders movement of electrons (that is, resistance may decrease). Here, current may easily flow.

When a reverse bias (for example, $V_D$<0) is input, the 2D semiconductor 400 may have a barrier that hinders the movement of the electrons. Here, the current may not easily flow.

In other words, the 2D semiconductor 400 may be formed by varying the thicknesses of the first layer 110 and the second layer 130, and thus a cost used for an additional process for a. junction may be saved.

Also, the 2D semiconductor 400 may determine a size of an initially generated Schottky barrier by adjusting the thickness of the 2D semiconductor 100, and thus it is possible to implement a device performance used in various locations. The 2D semiconductor 400 may provide an additional degree of freedom in thickness in fabricating of a semiconductor device, so as to be included and fabricated in semiconductor devices with various structures.

Figure 8:
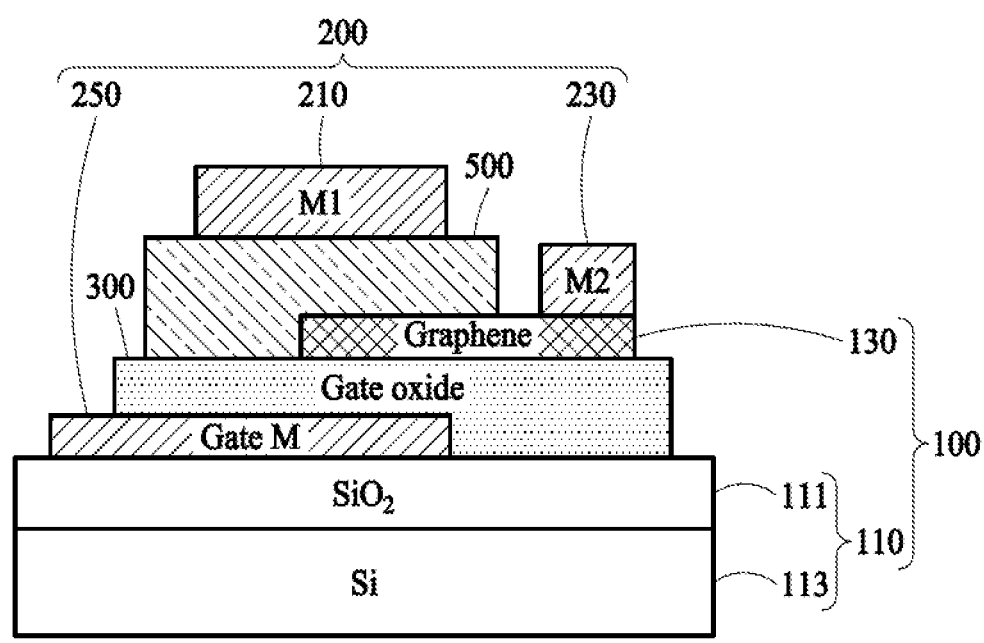
FIG. 8 illustrates yet another example of a barristor device-based photodetector.

FIG. 8 illustrates yet another example of a barristor device-based-photodetector.

Referring to FIG. 8, a shape of a photodetector 10 of FIG. 8 is not similar to a shape of the photodetector 10 of FIG. 4. The photodetector 10 of FIG. 8 includes a substrate 110, a graphene layer 130, a plurality of electrodes 200, and a gate insulating layer 300. Also, the photodetector 10 of FIG. 8 further includes an insulating layer 500.

The substrate 110 is similar to that of FIG. 4, and accordingly further description thereof is omitted. However, the insulating layer 500 may be laminated without contacting the substrate 110.

The graphene layer 130 may be formed between the substrate 110 and a second electrode 230 and may extend toward a first electrode 210. For example, the graphene in layer 130 may directly contact the second electrode 230, the gate insulating layer 300 and the insulating layer 500, and may be formed between the second electrode 230 and the gate insulating layer 300. Here, the gate insulating layer 300 may be laminated on the substrate 110 to be in direct contact with the substrate 110. The graphene layer 130 may be spaced apart from the substrate 110, the first electrode 210 and a gate electrode 250, is and disposed not to contact the substrate 110, the first electrode 210 and the gate electrode 250.

The first electrode 210 and the second electrode 230 may be laminated above the substrate 110 and may be spaced apart from the gate electrode 250.

For example, the first electrode 210 may be laminated on the insulating layer 500 to be in direct contact with the insulating layer 500. Here, the insulating layer 500 may be laminated on the gate insulating layer 300 to be in direct contact with the gate insulating layer 300. The first electrode 210 may be spaced apart from the substrate 110, the graphene layer 130, the second electrode 230, the gate electrode 250 and the gate insulating layer 300, and disposed not to contact the substrate 110, the graphene layer 130, the second electrode 230, the gate electrode 250 and the gate insulating layer 300.

The second electrode 230 is similar to that of FIG. 4, and accordingly further description thereof is omitted. However, the second electrode 230 may be spaced apart from the insulating layer 500 and disposed not to contact the insulating layer 500.

The gate electrode 250 may be laminated on the substrate 110. For example, the gate electrode 250 may directly contact the substrate 110 and the gate insulating layer 300 and may be formed between the substrate 110 and the gate insulating layer 300. The gate electrode 250 may be spaced apart from the graphene layer 130, the plurality of electrodes 200 and the insulating layer 500 and disposed not to contact the graphene layer 130. the plurality of electrodes 200 and the insulating layer 500.

The first electrode 210, the second electrode 230 and the gate electrode 250 may be formed of the same metal (or metal layer), formed of different metals, or formed of polysilicon. For example, the first electrode 210 may be a drain electrode formed of the same metal (or metal layer) as or a different metal from the second electrode 230 and the gate electrode 250, or formed of polysilicon. The second electrode 230 may be a source electrode formed of the same metal (or metal layer) as or a different metal from the first electrode 210 and the gate electrode 250, or formed of polysilicon. The gate electrode 250 may be a gate electrode formed of the same metal (or metal layer) as or a different metal from the first electrode 210 and the second electrode 230, or formed of polysilicon. This corresponds to the first electrode 210, the second electrode 230 and the gate electrode 250 included in the photodetector 10 of FIG. 8, however, example embodiments are not limited thereto. For example, the above description may be equally applicable to the first electrode 210, the second electrode 230 and the gate electrode 250 included in the photodetectors 10 of FIGS. 4, 5 and 6.

The gate insulating layer 300 is similar to that of FIG. 4, and accordingly further description thereof is omitted. However, the gate insulating layer 300 may directly contact the insulating layer 500 and may be disposed under the insulating layer 500.

Also, the gate insulating layer 300 may be one of silicon oxide, silicon nitride, hafnium oxide, aluminum oxide, and titanium oxide. The gate insulating layer 300 may perform insulation so that the gate electrode 250 may not contact the graphene layer 130. This corresponds to the gate insulating layer 300 included in the photodetector 10 of FIG. 8, however, example embodiments are not limited thereto. For example, the above description may be equally applicable to the gate insulating layer 300 included in the photodetectors 10 of FIGS. 4, 5 and 6.

The insulating layer 500 may be formed between the graphene layer 130 and the to first electrode 210. For example, the insulating layer 500 may be formed to be in direct contact with the graphene layer 130, the first electrode 210 and the gate insulating layer 300. The insulating layer 500 may be spaced apart from the substrate 110, the second electrode 230 and the gate electrode 250 and disposed not to contact the substrate 110, the second electrode 230 and the gate electrode 250.

The insulating layer 500 may perform insulation so that the first electrode 210 may not contact the sphere layer 130.

The photodetector 10 implemented as shown in FIGS. 4, 5, 6 and 8 may specify and vary a wavelength band of energy of absorbed light, by adjusting a wavelength band of minimum energy of the absorbed light by changing gate voltage for the gate electrode 250. For example, the photodetector 10 may change the gate voltage for the gate electrode 250 to adjust the energy barrier $E_b$ of the barristor device 100 and adjust a height of a Schottky junction of a 2D semiconductor.

The photodetector 10 may provide technology of adjusting a wavelength band of minimum energy of absorbed light to be further widened using a 2D sear conductor having a characteristic in which an energy band gap varies depending on a thickness, and of more widely varying a wavelength band of energy of the absorbed light.

The photodetector 10 may simultaneously detect and measure an intensity and energy of light, based on the barristor device 100. For example, the photodetector 10 may be utilized in a sensor that measures various wavelength bands based on a combination of materials of the barristor device 100. The photodetector 10 may be utilized in a gas sensor by detecting and measuring energy of light and detecting a gas component. The photodetector 10 may be utilized in an image sensor by changing gate voltage and detecting energy of light. The photodetector 10 may be utilized in an image sensor that measures a visible ray region and an infrared ray (IR) region using a. barristor to device that measures the IR region. Here, the photodetector 10 may simultaneously measure an intensity and energy of light in the IR region.

Hereinafter, a photodetector 10 capable of amplifying a signal based on a barristor device as shown in FIGS. 9A through 10B will be described.

Figure 9A:
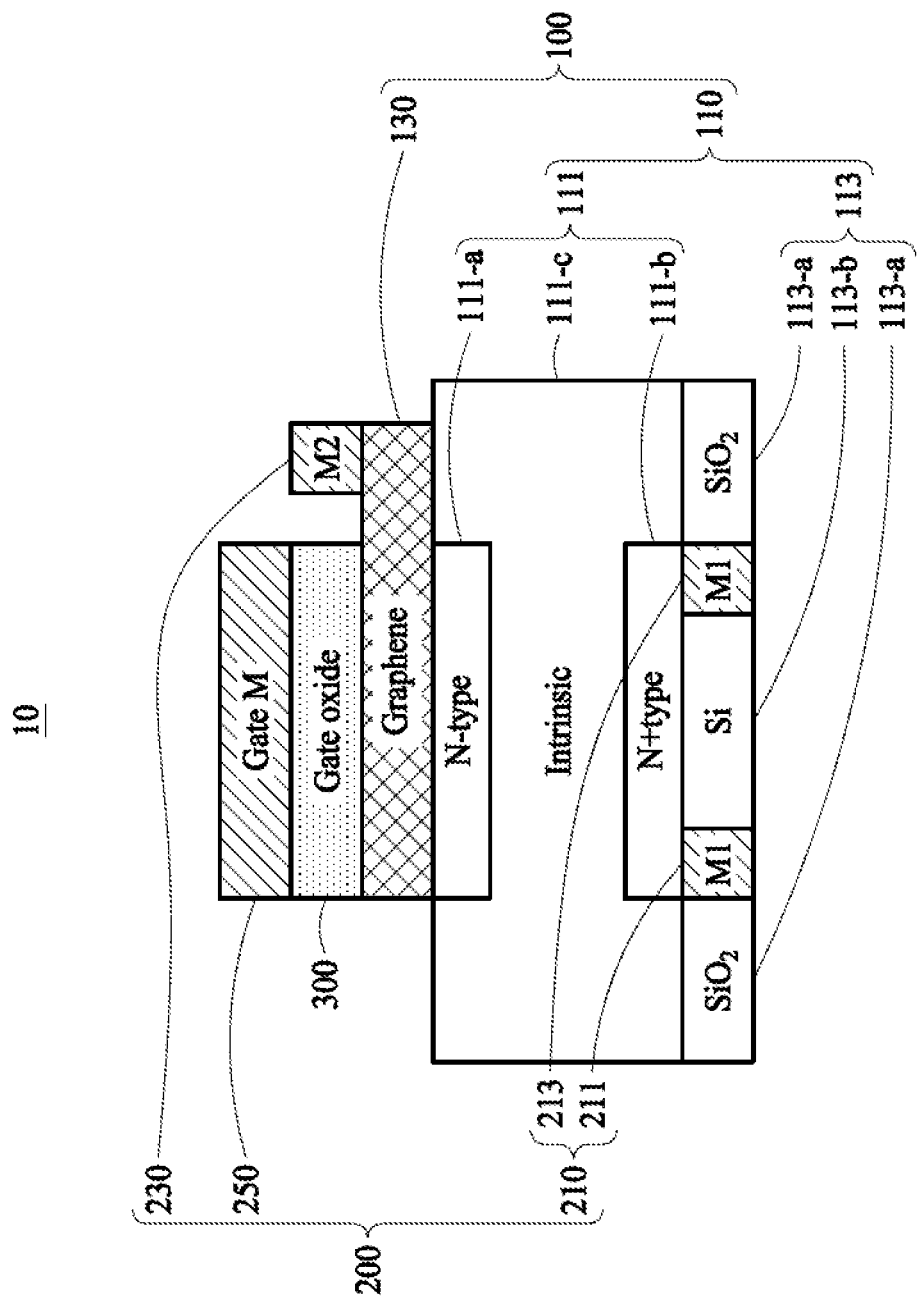
FIG. 9A illustrates an example of a photodetector capable of amplifying a signal based on a barristor device.
Figure 9B:
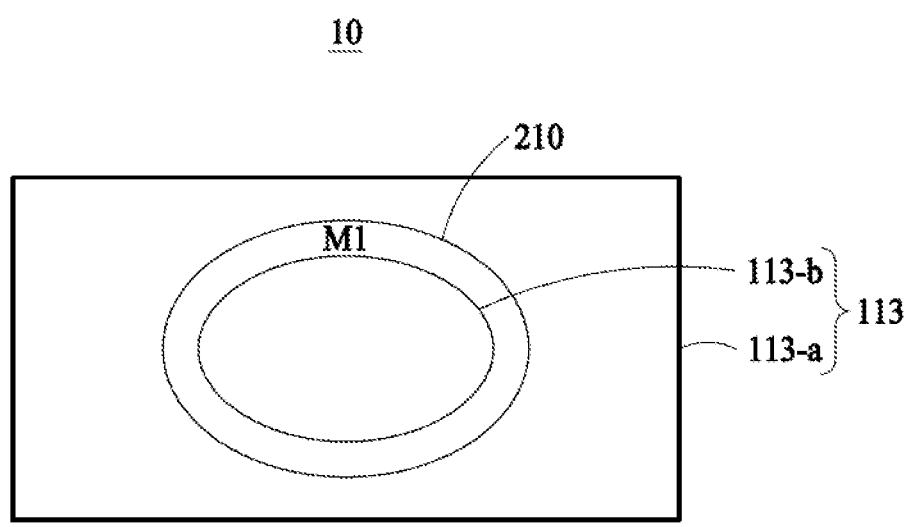
FIG. 9B illustrates an example of a bottom portion of the photodetector of FIG. 9A.

FIG. 9A illustrates an example of a photodetector capable of amplifying a signal based on a barristor device, and FIG. 9B illustrates an example of a bottom portion of the photodetector of FIG. 9A.

Referring to FIG. 9A, a photodetector 10 includes a substrate 110, a graphene layer 130, a plurality of electrodes 200, and a gate insulating layer 300. The plurality of electrodes 200 may include a first electrode 210, a second electrode 230, and a gate electrode 250.

The substrate 110 may include a first substrate 111 and a second substrate 113. For example, the first substrate 111 may be formed of Si. The second substrate 113 may be formed of at least one of $SiO_2$ 113-*a* and Si 113-*b*.

The first substrate 111 may include an n− type doped region 111-*a*, an n+ type doped region 111-*b*, and an intrinsic region 111-*c*. The n− type doped region 111-*a* may be formed man upper end of the first substrate 111. The n− type doped region 111-*a* may be formed to directly contact the intrinsic region The n+ type doped region 111-*b* may be formed in a lower end of the first substrate 111. The n+ type doped region 111-*b* may be formed to directly contact the intrinsic region 111-*c*. The type n− doped region 111-*a* and the n+ type doped region 111-*b* may not directly contact each other. The n− type doped region 111-*a* and the n+ type doped region 111-*b* may be formed in a central portion of the first substrate 111. The intrinsic region 111-*c* may be formed in regions of the first substrate 111 other than the n− type doped region 111-*a* and the n+ type doped region 111-*b*. The intrinsic region 111-*c* may be formed of Si.

The second substrate 113 may be disposed under the first substrate 111. For example, the $SiO_2$ 113-*a* formed in an outer peripheral portion of the second substrate 113 and the Si 113-*b* formed in a central portion of the second substrate 113 may be disposed to directly contact a bottom portion of the first substrate 111, The $SiO_2$ 113-*a* may be. formed to directly contact the intrinsic region 111-*c*. The Si 113-*b* may be formed to directly contact the n+ type doped region 111-*b*.

The graphene layer 130 may be formed between the first substrate 111 and the second electrode 230. For example, the graphene layer 130 may be laminated on the n− type doped region 111-*a* and the intrinsic region 111-*c* to be in direct contact with the n− type doped region 111-*a* and the intrinsic region 111-*c*. The graphene layer 130 may be formed to directly contact the second electrode 230 laminated on the graphene layer 130. The graphene layer 130 may extend from the second electrode 230 toward the. gate electrode 250. For example, the graphene layer 130 may be formed below the gate insulating layer 300, which is spaced apart from the second electrode 230. to be in direct contact with the gate insulating layer 300.

The first electrode 210 may be formed in the second substrate 113. For example. the first electrode 210 may be formed to be disposed between the $SiO_2$ 113-*a* and the Si 113-*b*. The first electrode 210 may be formed to directly contact the $SiO_2$ 113-*a* and the Si 113-*b*. The Si 113-*b* disposed within the first electrode 210 may be subject to anti-reflection coating.

The first electrode 210 may include a plurality of electrodes 211 and 213 disposed to correspond to both ends of the n+ type doped region 111-*b*. As shown in FIG. 9B, the first electrode 210 may be a circular electrode disposed to correspond to both ends of the n+ type doped region 111-*b* and implemented as an integral portion.

The plurality of electrodes 211 and 213, and the first electrode 210 that is implemented as a circular electrode may directly contact the n+ type doped region 111-*b*.

The second electrode 230 may be laminated above the first substrate 111. For example, the second electrode 230 may be laminated on the graphene layer 130 laminated on the first substrate 200, to be in direct contact with the graphene layer 130.

The second electrode 230 may be spaced apart from the gate electrode 250. For example, the second electrode 230 may be spaced apart from the gate insulating, layer 300 and the gate electrode 250 and disposed not to directly contact the gate insulating layer 300 and the gate electrode 250.

The gate insulating layer 300 may be formed between the gate electrode 250 and the graphene layer 130. For example, the gate insulating layer 300 may be formed so that the graphene layer 130 laminated on the first substrate 111 may not directly contact the gate electrode 250.

The gate electrode 250 may be laminated above the first substrate 110. For example, the gate electrode 250 may be laminated to be in direct contact the gate insulating layer 300 laminated on the graphene layer 130.

The first electrode 210, the second electrode 230 and the gate electrode 250 may be formed of the same metal (or metal layer), formed of different metals, or formed of polysilicon. For example, the first electrode 210 may be a drain electrode formed of the same metal (or metal layer) as or a different metal from the second electrode 230 and the gate electrode 250, or formed of polysilicon. The second electrode 230 may be a source electrode formed of the same metal (or metal layer) as or a different metal from the first electrode 210 and the gate electrode 250, or formed of polysilicon. The gate electrode 250 may be a gate electrode foamed of the same metal (or metal layer) as or a different metal from the first electrode 210 and the second electrode 230, or formed of polysilicon.

Figure 10A:
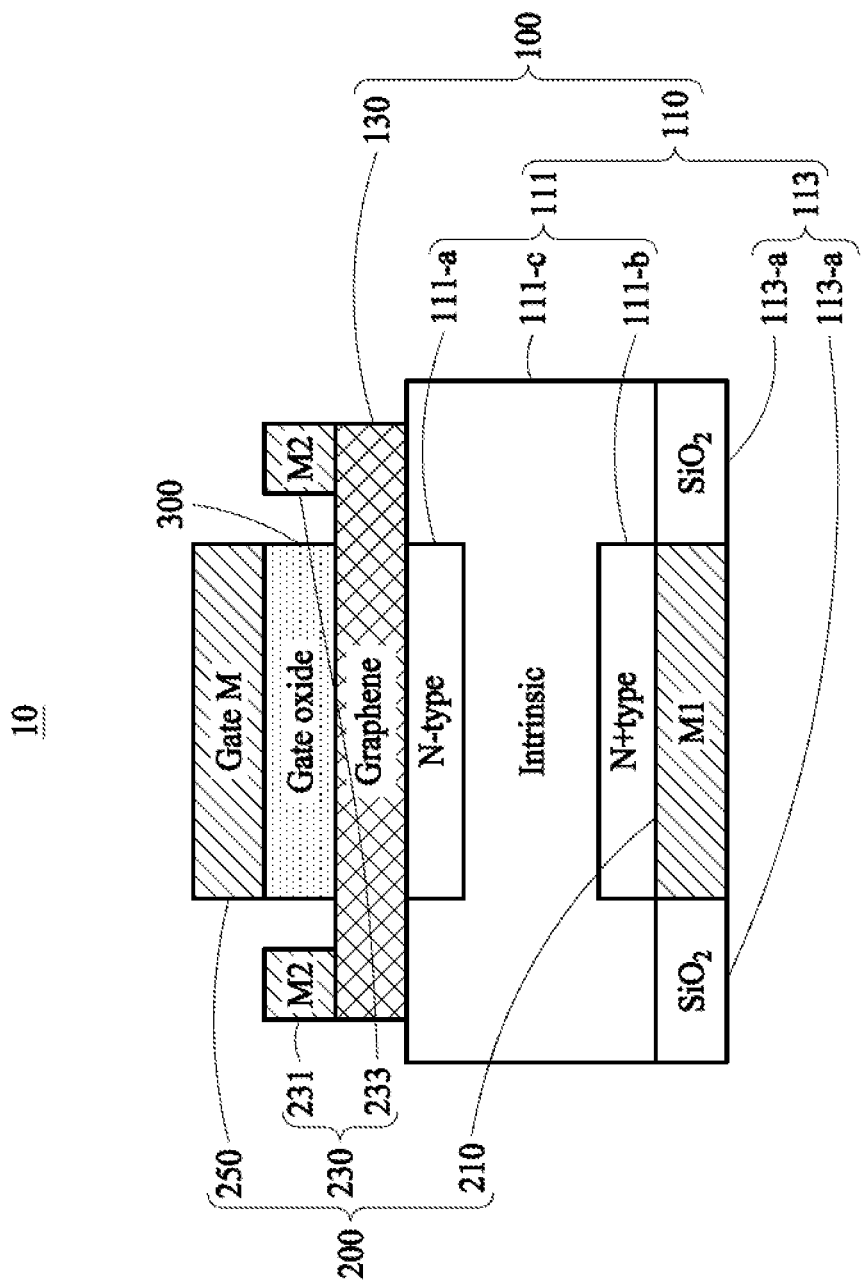
FIG. 10A illustrates another example of a photodetector capable of amplifying a signal based on a barristor device.
Figure 10B:
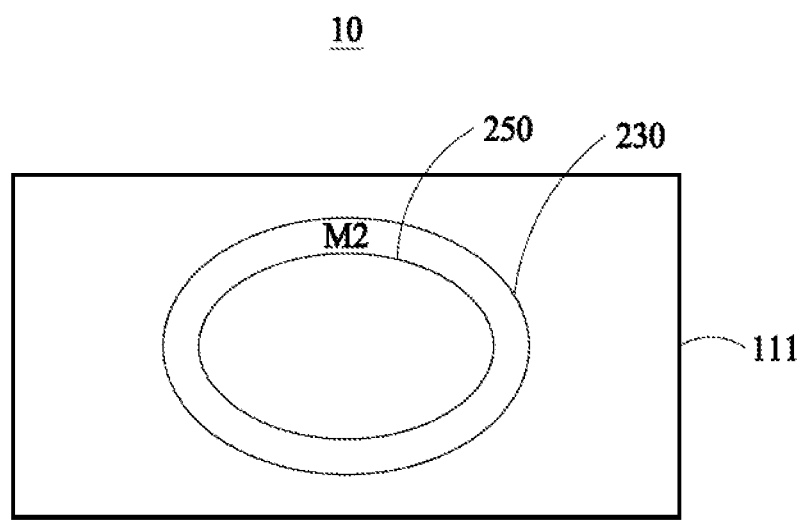
FIG. 10B illustrates an example of a top portion of the photodetector of FIG. 10A.

FIG. 10A illustrates another example of a photodetector capable of amplifying a to signal based on a barristor device, and FIG. 10B illustrates an example of a top portion of the photodetector of FIG. 10A.

Referring to FIG. 10A, a photodetector 10 includes a substrate 110, a graphene layer 130, a plurality of electrodes 200, and a gate insulating layer 300. The plurality of electrodes 200 may include a first electrode 210. a second electrode 230, and a gate is electrode 250.

The substrate 110 may include a first substrate 111 and a second substrate 113. For example, the first substrate 111 may be formed of Si. The second substrate 113 may be formed of SiO$_2$ 113-a.

The first substrate 111 of FIG. 10A is similar to of FIG. 9A, and accordingly further description thereof is omitted.

The second substrate 113 may be disposed under the first substrate 111. For example, the SiO$_2$ 113-a formed in an outer peripheral portion of the second substrate 113 may be disposed to directly contact a bottom portion of the first substrate 111. The SiO$_2$ 113-a may be formed to directly contact the intrinsic region 111-c.

The graphene layer 130 of FIG. 10A is similar to that of FIG. 9A, and accordingly further description thereof is omitted.

The first electrode 210 may be formed in the second substrate113. For example, the first electrode 210 may be formed in a central portion of the second substrate 113. The first electrode 210 Amy be formed to directly contact the SiO$_2$ 113-a.

The first electrode 210 may be disposed to correspond to the entire n+ type doped region 111-c. For example, the first electrode 210 may be formed to directly contact the entire n+ type doped region 111-c.

The second electrode 230 of FIG. 10A is similar to that of FIG. 9A, and accordingly further description thereof is omitted. However, the second electrode 230 may include a plurality of electrodes 231 and 233 spaced apart from both ends of each of the gate insulating layer 300 and the gate electrode 250 and disposed to correspond to both the ends. The second electrode 230 may be a circular electrode spaced apart from both ends of each of the gate insulating layer 300 and the gate electrode 250 and disposed to correspond to both the ends and implemented as an integral portion. As shown in FIG. 10B, the second electrode 230 may be a circular electrode disposed to directly contact both ends of each of the gate insulating layer 300 and the gate electrode 250 and implemented as an integral portion.

The gate insulating layer 300 and the gate electrode 250 of FIG. 10A are similar to those of FIG. 9A, and accordingly further description thereof is omitted. However, the gate electrode 250 may be transparent and anti-reflection coating may be applied to the gate electrode 250.

The first electrode 210 and the second electrode 230 may be formed of the same metal (or metal layer), formed of different metals, or formed of polysilicon, as described above with reference to FIGS. 9A and 9B. For example, the first electrode 210 may be a drain electrode formed of the same metal (or metal layer) as or a different metal from the second electrode 230, or formed of polysilicon. The second electrode 230 may be a source electrode formed of the same metal (or metal layer) as or a different metal from the first electrode 210, or formed of polysilicon.

The gate electrode 250 may be a gate electrode formed differently from the first electrode 210 and the second electrode 230. For example, the gate electrode 250 may be a transparent electrode formed differently from the first electrode 210 and the second electrode 230.

The gate insulating layer 300 may be one of silicon oxide, silicon nitride, hafnium oxide, aluminum oxide, and titanium oxide. The gate insulating layer 300 may perform to insulation so that the gate electrode 250 may not contact the graphene layer 130. This corresponds to the gate insulating layer 300 included in the photodetector 10 of FIGS. 10A and 10B, however, example embodiments are not limited thereto. For example, the above description may be equally applicable to the gate insulating layer 300 included in the photodetector 10 of FIGS. 9A and 9B.

The photodetector 10 implemented as shown in FIGS. 9A through 10B may specify and vary a wavelength band of energy of absorbed light, by adjusting a wavelength band of minimum energy of the absorbed light by changing gate voltage for the gate electrode 250. For example, the photodetector 10 may change the gate voltage for the gate electrode 250 to adjust an energy barrier $E_b$ of the barristor device 100 and adjust a height of a Schottky junction.

The photodetector 10 may provide technology of amplifying an electric signal based on light absorbed by the photodetector 10 by applying high voltage between the first electrode 210 and the second electrode 230 and using the first substrate 111 that includes the n– type doped region 111-a, the n+ type doped region 111-b and the intrinsic region 111-c.

The photodetector 10 may simultaneously detect and measure an intensity and energy of light, based on the barristor device 100. For example, the photodetector 10 may be utilized in a sensor that measures various wavelength bands based on a combination of materials of the barristor device 100. The photodetector 10 may be utilized in a gas sensor by detecting and measuring energy of light and detecting a gas component. The photodetector 10 may be utilized in an image sensor by changing gate voltage and detecting energy of light. The photodetector 10 may be utilized in an image sensor that measures a visible ray region and an IR region using a barristor device that measures the IR region. Here, the photodetector 10 may simultaneously measure an intensity and energy of light in the IR region.

Hereinafter, a light intensity extracting system 1 based on energy alight shown in FIG. 11, and a light intensity extracting apparatus 30 based on energy of light shown in FIG. 12 will be described.

Figure 11:
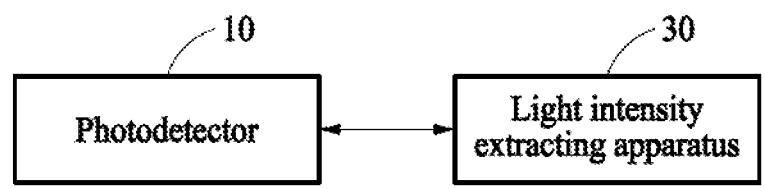
FIG. 11 illustrates an example of a light intensity extracting system based on energy of light according to an example embodiment.

FIG. 11 illustrates an example of a light intensity extracting system base(on energy of light according to an example embodiment.

Referring to FIG. 11, a light intensity extracting system 1 based on energy of light includes a photodetector 10, and a light intensity extracting apparatus 30 based on energy of light.

The photodetector 10 of FIG. 11 is similar to those of FIGS. 4 through 10B, and accordingly further description thereof is omitted.

The light intensity extracting apparatus 30 may measure and transform a spectral response of a barristor device 100 included in a photodetector 10, and photocurrent of light projected to the barristor device 100.

The light intensity extracting apparatus 30 may extract an intensity value based on energy it the light projected to the barristor device 100, based on a transformation result.

In other words, the light intensity extracting apparatus 30 may extract the intensity value based on the energy of the light projected to the barristor device 100 by measuring and transforming the spectral response of the barristor device 100 included in a photodetector 10, and the photocurrent of the light projected to the barristor device 100.

Figure 12:
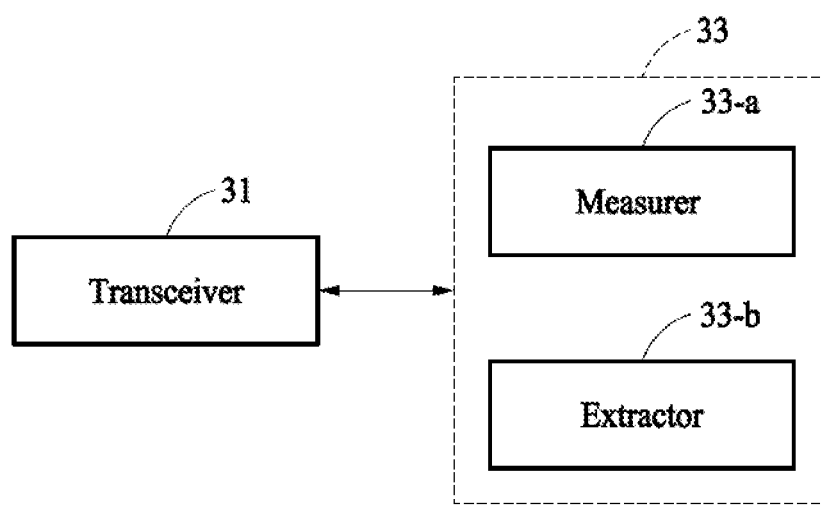
FIG. 12 illustrates an example of a light intensity extracting apparatus based on energy of light shown in FIG. 11.

FIG. 12 illustrates an example of the light intensity extracting apparatus FIG. 11.

Referring to FIG. 12, the light intensity extracting apparatus 30 includes a transceiver 31 and a controller 33.

The transceiver 31 may communicate with the photodetector 10.

For example, the transceiver 31 may communicate with the photodetector 10. based on various networks, for example, an Internet communication network, an intranet, a local area network (LAN), a wireless LAN, LF. Xbee, Zigbee, Blue-Tooth, and Beacon.

The transceiver 31 may receive a signal (or data) generated in the photodetector 10 and may transmit the received signal (or data) to the controller 33. The signal (or data) may include photocurrent.

The controller 33 may control an overall operation of the light intensity extracting apparatus 30. For example, the controller 33 may control an operation of the transceiver 31.

The controller 33 may measure a spectral response of a barristor device 100 included in the photodetector 10, and photocurrent of light projected to the barristor device 100.

The controller 33 may extract an intensity value (or a spectrum value of light) based on energy of light by performing a Fourier transform on the spectral response and the photocurrent.

The controller 33 may include a measurer 33-$a$ and an extractor 33-$b$.

The measurer 33-$a$ may measure a spectral response. For example, the measurer 33-$a$ may measure a. characteristic of the barristor device 100 and extract the spectral response. The spectral response may be a spectral response based on characteristics for each device of the barristor device 100.

The measurer 33-$a$ may project various lights to the barristor device 100. Here, the various lights may be light set in advance to have different energy.

The measurer 33-$a$ may measure photocurrent generated in the barristor device 100 and measure a characteristic of the barristor device 100, to extract the spectral response of the barristor device 100. For example, when energy of the projected light is greater than or equal to specific energy, photocurrent may be generated in the barristor device 100.

The measurer 33-$a$ may determine a spectral response using Equation 1 shown below.

$$\text{Spectral Response} = T(\Phi_B(V_G)-E) \qquad \text{[Equation 1]}$$

In Equation 1, Spectral Response denotes the spectral response, $V_G$ denotes gate voltage of a barristor device, $\Phi_B$ denotes a Schottky barrier height of the barristor device, T denotes a function value of a Schottky harrier of the. barristor device, and E denotes energy of light projected to the barristor device. For example, T may be a transform value for a degree to which light is transformed to current based on energy of light in an optical sensor. T may change based on the gate voltage.

The measurer 33-$a$ may measure at least one of photocurrent and a differential value of the photocurrent, based on gate voltage of the photodetector 10.

When specific voltage is applied as gate voltage of the photodetector 10 and when light is projected to the barristor device 100, the measurer 33-$a$ may measure photocurrent generated in the barristor device 100.

The measurer 33-$a$ may determine photocurrent using Equation 2 shown below.

$$I_{ph}(V_G) = \int \psi(E) T(\Phi_B(V_G)-E) dE \qquad \text{[Equation 2]}$$

In Equation 2, $I_{ph}$ denotes photocurrent, $I_{ph}(V_G)$ denotes photocurrent based on gate voltage of a barristor device, and $\psi(E)$ denotes an intensity value (of a spectrum value of light) based on energy of light projected to the barristor device.

The measurer 33-$a$ may measure the differential value of the photocurrent using a lock-in amplification scheme. For example, the lock-in amplification scheme may be used for actual measurement.

The measurer 33-$a$ may measure a differential value of photocurrent using, Equation 3 shown below.

$$\frac{\partial I_{ph}}{\partial V_G} = \int \psi(E) \frac{\partial T(\Phi_B(V_G)-E)}{\partial V_G} dE \qquad \text{[Equation 3]}$$

In Equation 3, $$\frac{\partial I_{ph}}{\partial V_G}$$

denotes the differential value of the photocurrent.

The extractor 33-$b$ may perform a Fourier transform on the spectral response.

A Fourier transform value for the spectral response may be determined using Equation 4 shown below.

$$F\{T(\Phi_B(V_G)-E)\} \qquad \text{[Equation 4]}$$

In Equation 4, F{ } denotes a Fourier transform function.

The extractor 33-$b$ may perform a Fourier transform on at least one of the photocurrent and the differential value of the photocurrent.

A Fourier transform value for the photocurrent may be determined using Equation 5 shown below.

$$F\{I_{ph}(V_G)\} = F\{\psi(E)\} F\{T(T(\Phi_B(V_G)-E)\} \qquad \text{[Equation 5]}$$

A Fourier transform value for the differential value of the photocurrent may he determined using Equation 6 shown below.

$$F\left\{\frac{\partial I_{ph}}{\partial V_G}\right\} = F\{\psi(E)\} F\left\{\frac{\partial T(\Phi_B(V_G)-E)}{\partial V_G}\right\} \qquad \text{[Equation 6]}$$

The extractor 33-$b$ may perform a deconvolution of at least one of a Fourier transform result for the photocurrent and a Fourier transform result for the differential value of the photocurrent, based on a Fourier transform result for the spectral response.

A deconvolution result for the photocurrent may be determined using Equation 7 shown below.

$$F\{\psi(E)\}=F\{T(\Phi_B(V_G)-E)\}/F\{I_{ph}\} \quad \text{[Equation 7]}$$

A deconvolution result for the differential value of the photocurrent may be determined using Equation 8 shown below.

$$F\{\psi(E)\} = F\left\{\frac{\partial T(\Phi_B(V_G)-E)}{\partial V_G}\right\}/F\left\{\frac{\partial I_{ph}}{\partial V_G}\right\} \quad \text{[Equation 8]}$$

The extractor 33-b may extract an intensity value (or a spectrum value of light) based on energy of light by performing an inverse Fourier transform on the deconvolution result.

An intensity value (or a spectrum value of light) based on energy of light through the photocurrent may be determined using Equation 9 shown below.

$$\psi(E) = F^{-1}\left\{\frac{F\{T(\Phi_B(V_G)-E)\}}{F\{I_{ph}\}}\right\} \quad \text{[Equation 9]}$$

An intensity value (or a spectrum value of light) based on energy of light through the differential value of the photocurrent may be determined using Equation 10 shown below.

$$\psi(E) = F^{-1}\left\{\frac{F\left\{\frac{\partial T(\Phi_B(V_G)-E)}{\partial V_G}\right\}}{F\left\{\frac{\partial I_{ph}}{\partial V_G}\right\}}\right\} \quad \text{[Equation 10]}$$

Figure 13:
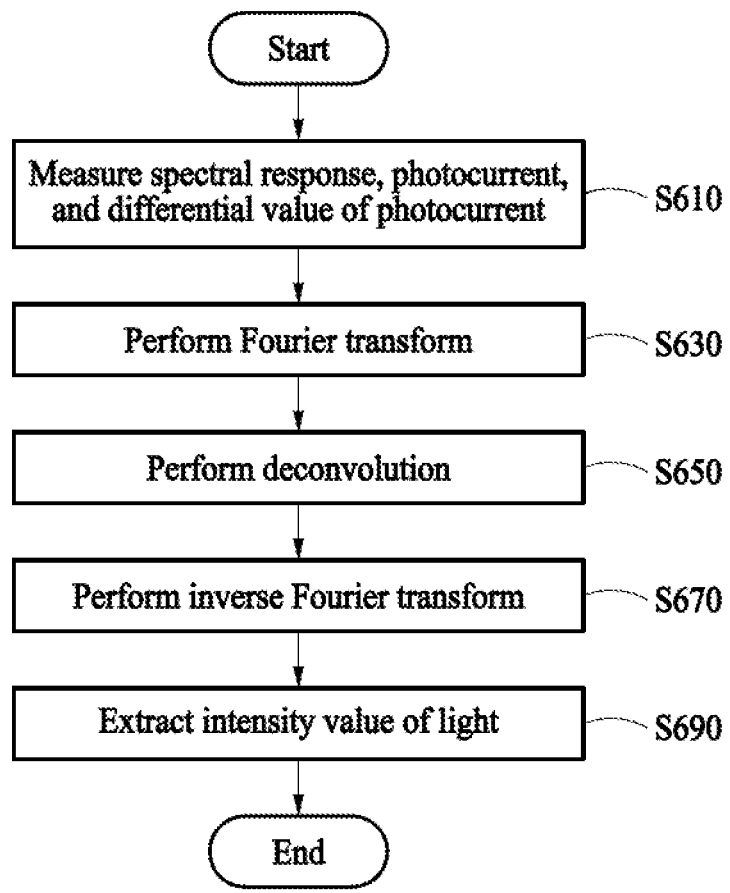
FIG. 13 is a flowchart illustrating an operation of the light intensity extracting apparatus of FIG. 11.

FIG. 13 is a flowchart illustrating an operation of the light intensity extracting apparatus of FIG. 11.

Referring to FIG. 13, operation S610, the measurer 33-a may measure a spectral response of the barristor device 100, and may measure least one of photocurrent of light projected to the barrister device 100 and a differential value of the photocurrent.

For example, the measurer 33-a may measure the spectral response, and measure the photocurrent.

The measurer 33-a may measure the spectral response, and measure the to differential value of the photocurrent.

The measurer 33-a may measure the spectral response, and measure the photocurrent and a differential value of the photocurrent.

In operation S630 the extractor 33-b may perform a Fourier transform on the spectral response, and may perform a Fourier transform on at least one of the photocurrent and the differential value of the photocurrent.

For example, the extractor 33-b may perform the Fourier transform on the spectral response, and may perform the Fourier transform on the photocurrent.

The extractor 33-b may perform the Fourier transform on the spectral response, and may perform the Fourier transform on the differential value of the photocurrent.

The extractor 33-b may perform the Fourier transform on the spectral response, and may perform the Fourier transform on the photocurrent and the differential value of the photocurrent.

In operation S650, the extractor 33-b may perform a deconvolution of at least one of a Fourier transform result for the photocurrent and a Fourier transform result for the differential value of the photocurrent, based on a Fourier transform result for the spectral response.

For example, the extractor 33-b may perform a deconvolution based on the Fourier transform result for the spectral response and the Fourier transform result for the photocurrent.

The extractor 33-b may perform a deconvolution based on the Fourier transform result for the spectral response and the Fourier transform result for the differential value of the photocurrent.

The extractor 33-b may perform a deconvolution based on the Fourier transform result for the spectral response, the Fourier transform result for the photocurrent and the to Fourier transform result for the differential value of the photocurrent.

In operation S670, the extractor 33-b may perform an inverse Fourier transform on a deconvolution result.

For example, the extractor 33-b may perform an inverse Fourier transform on a deconvolution result for the spectral response and a deconvolution result for the photocurrent.

The extractor 33-b may perform an inverse Fourier transform on a deconvolution result for the spectral response and a deconvolution result for the differential value of the photocurrent.

In operation S690, the extractor 33-b may extract an intensity value (or a spectrum value of light) based on energy of light projected to the barristor device 100, through an inverse Fourier transform.

Hereinafter, an image sensor of FIG. 14 including a photodetector 10, and a plurality of pixels shown in FIGS. 15 and 16 will be described.

Figure 14:
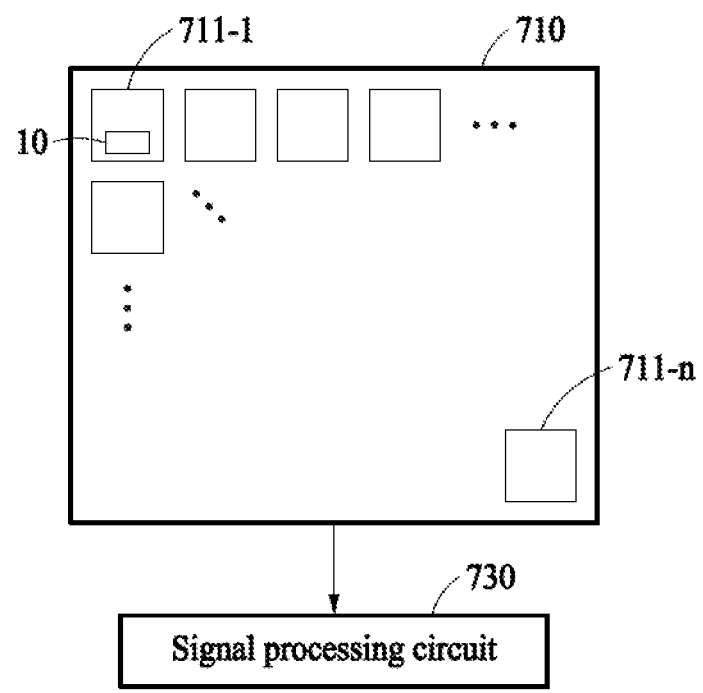
FIG. 14 illustrates an example of an image sensor including a photodetector capable of amplifying a signal based on a barristor device.
Figure 15:
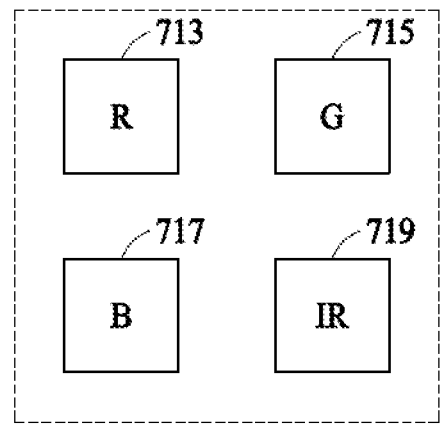
FIG. 15 illustrates an example of a plurality of pixels of FIG. 14.
Figure 16:
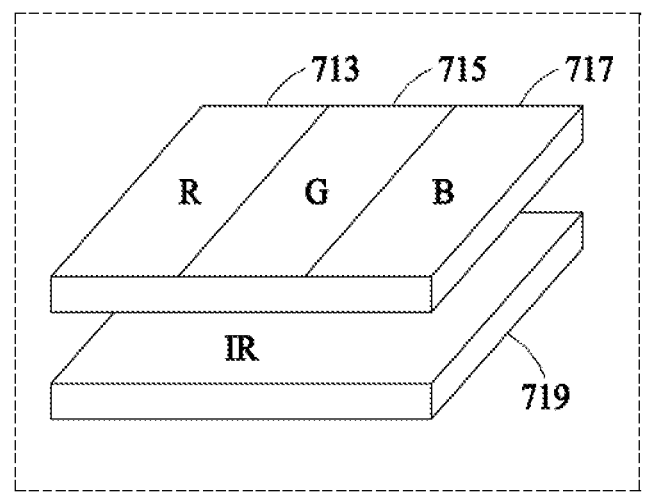
FIG. 16 illustrates another example of a plurality of pixels of FIG. 14.

FIG. 14 illustrates an example of an image sensor including a photodetector capable of amplifying a signal based on a barristor device, FIG. 15 illustrates an example of a plurality of pixels of FIG. 14, and FIG. 16 illustrates another example of a plurality of pixels of FIG. 14.

Referring to FIGS. 14 through 16, an image sensor 700 includes a pixel army 710, and a signal processing circuit 730. The pixel array 710 may include a plurality of pixels 711-1 through 711-n. Each of the plurality of pixels 711-1 through 711-n may include a photodetector 10.

The plurality of pixels 711-1 through 711-n may include a plurality of color pixels 713, 715 and 717, and an infrared ray (IR) pixel 719. The plurality of color pixels 713, 715 and 717 may be a red pixel 713, a green pixel 715, and a. blue pixel 717. respectively.

In an example, as shown in FIG. 15, the plurality of color pixels 713, 715 and 717, and the infrared ray (IR) pixel 719 may be configured with a planar cell structure.

In another example, as shown in FIG. 16, the plurality of color pixels 713, 715 and 717, and the infrared ray (ER) pixel 719 may be configured with a tandem cell structure.

The plurality of pixels 711-1 through 711-n may include a barristor device-based photodetector 10. For example, to detect light in a visible ray band, each of the plurality of color pixels 713, 715 and 717 may include a barristor device-based photodetector 10. The IR pixel 619 may include a barristor device-based photodetector 10, to detect light in an infrared band. The IR pixel 719 may be a spectroscopic IR pixel.

The photodetector 10 is the same as the photodetectors described above with reference to FIGS. 4 through 10B, and accordingly further description thereof is omitted.

The image sensor 700 may generate an image for light incident on the image sensor 700, through the pixel array 710 and the signal processing circuit 730.

For example, the pixel array 710 may output an amount of charges according to an intensity based on energy of the light incident on the image sensor 700 through the photodetector 10. The pixel array 710 may transmit a signal for at least one of a visible ray band and an infrared band corresponding to an amount of charges output through the plurality of color pixels 713, 715 and 717, and the a pixel 719 to the signal processing circuit 730. Here, the signal may be an analog signal.

The signal processing circuit 730 may generate and transmit an image signal corresponding to at least one of the visible ray band and the infrared band through the received signal. Here, the image signal may be a digital signal.

The apparatuses described herein may be implemented using a hardware to component, a software component and/or a combination thereof. For example, the apparatuses and components described in the example embodiments may be implemented using one or more general-purpose or special purpose computer, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. A processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

Software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described example embodiments may be to recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa, While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. A method of extracting a light intensity based on energy of light, the method comprising:

measuring a spectral response of a barristor device included in a photodetector, and photocurrent of light projected to the barristor device; and extracting an intensity value based on energy of the light by performing a Fourier transform on the spectral response and the photocurrent.

2. The method of claim 1, wherein the measuring comprises:

in measuring the spectral response; and measuring at least one of the photocurrent and a differential value of the photocurrent, based on gate voltage of the photodetector.

3. The method of claim 2, wherein the measuring of at least one of the photocurrent and the differential value of the photocurrent comprises measuring the differential value of the photocurrent through a lock-in amplification scheme.

4. The method of claim 2, wherein the measuring of the spectral response comprises determining the spectral response using the following equation:

$$\text{Spectral Response} = T(\Phi_B(V_G) - E) \quad \text{[Equation]}$$

wherein Spectral Response denotes the spectral response, $V_G$ denotes gate voltage of the barristor device, $\Phi_B$ denotes a Schottky barrier height of the barristor device, T denotes a function value of a Schottky barrier of the barristor device, and E denotes energy of light projected to the barristor device.

5. The method of claim 4, wherein the measuring of at least one of the photocurrent and the differential value of the photocurrent further comprises determining the photocurrent using the following equation:

$$I_{ph}(V_G) = \int \psi(E) T(\Phi_B(V_G) - E) dE \quad \text{[Equation]}$$

wherein $I_{ph}$ denotes the photocurrent, $I_{ph}(V_G)$ denotes photocurrent based on the gate voltage of the barristor device, and ψ(E) denotes an intensity value based on the energy of the light projected to the barristor device.

6. The method of claim 5, wherein the measuring of at least one of the photocurrent and the differential value of the photocurrent further comprises determining the differential value of the photocurrent using the following equation:

$$\frac{\partial I_{ph}}{\partial V_G} = \int \psi(E) \frac{\partial T(\Phi_B(V_G) - E)}{\partial V_G} dE \quad \text{[Equation]}$$

wherein $$\frac{\partial I_{ph}}{\partial V_G}$$

denotes the differential vale f the photocurrent.

7. The method of claim 6, wherein the extracting comprises:
performing a Fourier transform on the spectral response;
performing a Fourier transform on at least one of the photocurrent and the differential value of the photocurrent;
performing a deconvolution based on a Fourier transform result for the spectral response and at least one of a Fourier transform result for the photocurrent and a Fourier transform result for the differential value of the photocurrent; and
extracting the intensity value based on the energy of the light by performing an inverse Fourier transform on a result of the deconvolution.

8. The method of claim 7, wherein a Fourier transform value for the spectral response is determined using the following equation:

$$F\{T(\Phi_B(V_G)-E)\} \quad \text{[Equation]}$$

wherein F{ } denotes a Fourier transform function.

9. The method of claim 8, wherein a Fourier transform value for the photocurrent is determined using the following equation:

$$F\{I_{ph}(V_G)\}=F\{\psi(E)\}F\{T(\Phi_B(V_G)-E)\}. \quad \text{[Equation]}$$

10. The method of claim 9, wherein a Fourier transform value for the differential value of the photocurrent is determined using the following equation:

$$F\left\{\frac{\partial I_{ph}}{\partial V_G}\right\} = F\{\psi(E)\}F\left\{\frac{\partial T(\Phi_B(V_G) - E)}{\partial V_G}\right\}. \quad \text{[Equation]}$$

11. The method of claim 10, wherein a deconvolution result for the photocurrent is determined using the following equation:

$$F\{\psi(E)\}=F\{T(\Phi_B(V_G)-E)\}/F\{I_{ph}\}. \quad \text{[Equation]}$$

12. The method of claim 11, wherein a deconvolution result for the differential value of the photocurrent is determined using the following equation:

$$F\{\psi(E)\} = F\left\{\frac{\partial T(\Phi_B(V_G) - E)}{\partial V_G}\right\} / F\left\{\frac{\partial I_{ph}}{\partial V_G}\right\}. \quad \text{[Equation]}$$

13. The method of claim 12, wherein an intensity value based on energy of light through the photocurrent is determined using the following equation:

$$\psi(E) = F^{-1}\left\{\frac{F\{T(\Phi_B(V_G) - E)\}}{F\{I_{ph}\}}\right\}. \quad \text{[Equation]}$$

14. The method of claim 13, wherein an intensity value based on energy of light through the differential value of the photocurrent is determined using the following equation:

$$\psi(E) = F^{-1}\left\{\frac{F\left\{\frac{\partial T(\Phi_B(V_G) - E)}{\partial V_G}\right\}}{F\left\{\frac{\partial I_{ph}}{\partial V_G}\right\}}\right\}. \quad \text{[Equation]}$$

15. An apparatus for extracting a light intensity based on energy of light, the apparatus comprising:
a transceiver configured to communicate with a photodetector; and
a controller configured to measure a spectral response of a barristor device included in the photodetector, and photocurrent of light projected to the barristor device, and configured to extract an intensity value based on energy of the light by performing a Fourier transform on the spectral response and the photocurrent.

16. The apparatus of claim 15, wherein the controller comprises a measurer configured to measure the spectral response and to measure at least one of the photocurrent and a differential value of the photocurrent based on gate voltage of the photodetector.

17. The apparatus of claim 16, wherein the measurer is configured to measure the differential value of the photocurrent through a lock-in amplification scheme.

18. The apparatus of claim 16, wherein the measurer is configured to determine the spectral response using the following equation:

$$\text{Spectral Response}=T(\Phi_B(V_G)-E) \quad \text{[Equation]}$$

wherein Spectral Response denotes the spectral response, $V_G$ denotes gate voltage of the barristor device, $\Phi_B$ denotes a Schottky barrier height of the barristor device. T denotes a function value of a Schottky barrier of the barristor device, and E denotes energy of light projected to the barristor device.

19. The apparatus of claim 18, wherein the measurer is configured to determine the photocurrent using the following equation:

$$I_{ph}(V_G)=\int\psi(E)T(\Phi_B(V_G)-E)dE \quad \text{[Equation]}$$

wherein $I_{ph}$ denotes the photocurrent, $I_{ph}(V_G)$ denotes photocurrent based on the gate voltage of the barristor device, and ψ(E) denotes an intensity value based on the energy of the light projected to the barristor device.

20. The apparatus of claim 19, wherein the measurer is configured to determine the differential value of the photocurrent using the following equation:

$$\frac{\partial I_{ph}}{\partial V_G} = \int \psi(E) \frac{\partial T(\Phi_B(V_G) - E)}{\partial V_G} dE \quad \text{[Equation]}$$

wherein $$\frac{\partial I_{ph}}{\partial V_G}$$

denotes the differential value of the photocurrent.

21. The apparatus of claim 20, wherein the controller comprises an extractor configured to perform a Fourier transform on the spectral response, to perform a Fourier transform on at least one of the photocurrent and the differential value of the photocurrent, to perform a deconvolution based on a Fourier transform result for the spectral response and at least one of a Fourier transform result for the photocurrent and a Fourier transform result for the differential value of the photocurrent, and to extract the intensity value based on the energy of the light by performing an inverse Fourier transform on a result of the deconvolution.

22. The apparatus of claim 21, wherein a Fourier transform value for the spectral response is determined using the following equation:

$$F\{T(\Phi_B(V_G)-E)\} \qquad \text{[Equation]}$$

wherein F{ } denotes a Fourier transform function.

23. The apparatus of claim 22, wherein a Fourier transform value for the photocurrent is determined using the following equation:

$$F\{I_{ph}(V_G)\}=F\{\psi(E)\}F\{T(\Phi_B(V_G)-E)\}. \qquad \text{[Equation]}$$

24. The apparatus of claim 23, wherein a Fourier transform value for the differential value of the photocurrent is determined using the following equation:

$$F\left\{\frac{\partial I_{ph}}{\partial V_G}\right\} = F\{\psi(E)\}F\left\{\frac{\partial T(\Phi_B(V_G)-E)}{\partial V_G}\right\}. \qquad \text{[Equation]}$$

25. The apparatus of claim 24, wherein a deconvolution result for the to photocurrent is determined using the following equation:

$$F\{\psi(E)\}=F\{T(\Phi_B(V_G)-E)\}/F\{I_{ph}\}. \qquad \text{[Equation]}$$

26. The apparatus of claim 25, wherein a deconvolution result for the. is differential value of the photocurrent is determined using the following equation:

$$F\{\psi(E)\} = F\left\{\frac{\partial T(\Phi_B(V_G)-E)}{\partial V_G}\right\}/F\left\{\frac{\partial I_{ph}}{\partial V_G}\right\}. \qquad \text{[Equation]}$$

27. The apparatus of claim 26, wherein an intensity value based on energy of light through the photocurrent is determined using the following equation:

$$\psi(E) = F^{-1}\left\{\frac{F\{T(\Phi_B(V_G)-E)\}}{F\{I_{ph}\}}\right\}. \qquad \text{[Equation]}$$

28. The apparatus of claim 27, wherein an intensity value based on energy of light through the differential value of the photocurrent is determined using the. following equation $$\psi(E) = F^{-1}\left\{\frac{F\left\{\frac{\partial T(\Phi_B(V_G)-E)}{\partial V_G}\right\}}{F\left\{\frac{\partial I_{ph}}{\partial V_G}\right\}}\right\}. \qquad \text{[Equation]}$$

* * * * *